United States Patent [19]

Thomas

[11] Patent Number: 4,491,530

[45] Date of Patent: Jan. 1, 1985

[54] BROWN STAIN SUPPRESSING PHENOL FREE AND CHLORINATED HYDROCARBONS FREE PHOTORESIST STRIPPER

[75] Inventor: Evan G. Thomas, East Aurora, N.Y.

[73] Assignee: Allied Corporation, Morris Township, Morris County, N.J.

[21] Appl. No.: 496,764

[22] Filed: May 20, 1983

[51] Int. Cl.$^3$ ............................ C11D 3/43; B08B 3/08
[52] U.S. Cl. .................................... 252/143; 252/549; 252/558; 252/171
[58] Field of Search .................. 134/38; 252/142, 143, 252/151, 549, 171, 558

[56] References Cited

U.S. PATENT DOCUMENTS

| | | | |
|---|---|---|---|
| 4,070,203 | 1/1978 | Neisius et al. | 134/3 |
| 4,165,294 | 8/1979 | Vander Mey | 252/143 |
| 4,165,295 | 8/1979 | Vander Mey | 252/143 |
| 4,215,005 | 7/1980 | Vander Mey | 252/153 |
| 4,304,681 | 12/1981 | Martin et al. | 252/143 |
| 4,395,348 | 7/1983 | Lee | 252/143 |
| 4,401,747 | 8/1983 | Ward et al. | 430/258 |
| 4,403,029 | 9/1983 | Ward et al. | 430/258 |

OTHER PUBLICATIONS

Bakos, P. et al., "Stripping Agent for Photoresists, ", *IBM Technical Disclosure Bulletin*, vol. 8, No. 12, May 1966.

*Primary Examiner*—Prince E. Willis
*Attorney, Agent, or Firm*—Arthur J. Plantamura; Richard C. Stewart; Jay P. Friedenson

[57] ABSTRACT

Stripping solution compositions which avoid the problem know as "brown staining" are provided. Relevant stripping solutions are those that are free from phenol and chlorinated hydrocarbon compounds and comprise a surfactant alkylarylsulfonic acid having 12-20 carbons, a hydrotropic aromatic sulfonic acid having 6-9 carbons and a halogen-free aromatic hydrocarbon solvent with a boiling point above 150° C. To suppress brown staining, a water soluble sulfone is incorporated into the stripping solution. The stripping compositions effectively remove organic polymeric substances from inorganic substrates and are substantially clear water rinsable.

7 Claims, No Drawings

BROWN STAIN SUPPRESSING PHENOL FREE AND CHLORINATED HYDROCARBONS FREE PHOTORESIST STRIPPER

BACKGROUND OF THE INVENTION

This invention relates to stripping solutions for removing polymeric organic materials coated onto various metal, metal oxide, glass or insoluble polymeric substrate surfaces and provides organic mixtures comprised of sulfonic acids, hydrocarbons and sulfones, constituted in such a way to be compatible with aluminum and semiconductor manufacture. Specifically, this invention provides a sulfonic acid-hydrocarbon based stripping solution that will not generate brown stains on aluminum substrate during semiconductor processing of substrate aluminum.

During manufacture of semiconductors and semiconductor microcircuits, it is frequently necessary to coat the materials from which the semiconductors and microcircuits are manufactured with a polymeric organic substance, generally referred to as a photoresist, e.g., a substance which forms an etch resist upon exposure to light. These photoresists are used to protect selected areas of the surface of the sustrate, e.g., silicon, $SiO_2$ or aluminum, from the action of the etchant while such etchant selectively attacks the unprotected area of the substrate. Following completion of the etching operation and washing away of the residual etchant, it is necessary that the resist be removed from the protective surface to permit essential finishing operations.

A common method used in removing the photoresist from the substrate is by contacting the substrate with an organic stripper. These organic strippers in the past have been composed of various components whose purpose it was to lift and remove the polymeric photoresist from the substrate and usually contained phenol or phenol compounds and chlorinated hydrocarbon compounds. The use of phenol or phenol compounds or chlorinated hydrocarbon compounds results in a distinct disadvantage due to the toxicity of phenol as well as the pollution problems arising from the disposal of phenol or phenol compounds such as cresols, phenol sulfonic acid and the like or the disposal of chlorinated hydrocarbon compounds. U.S. Pat. No. 4,165,294 discloses stripping solutions that are phenol-free and chlorinated hydrocarbon-free and that are water rinsable.

The stripping solutions of U.S. Pat. No. 4,165,294 while performing effectively have been found to have the drawbacks of generating brown stains during processing, particularly on aluminum substrates, used in semiconductor elements. Brown stains of this character are unsightly and in some cases affect performance. Both of these drawbacks are undesireable. It is accordingly indicated that a need exists for a phenol-free and chlorinated hydrocarbon-free stripping solution which in use do not evidence a brown stain of the semiconductor substrate.

SUMMARY OF THE INVENTION

The present invention provides an improvement in stripping compositions of the kind disclosed in U.S. Pat. No. 4,165,294 in that it obviates a problem involving adverse effects on substrate metals, principally aluminum, which is known to occur with stripping compositions of the kind disclosed in that patent. This problem commonly takes the form of a brown stain visible on aluminum bonding a contact pads under 50 to 100X magnification. Since brown bond pad formation is undesired in semiconductor processing, use of sulfonic acid based strippers is jeopardized.

The invention has an object to provide a stripping solution that will not interact adversely with substrates, particularly aluminum, to form a staining effect which is undesireable in semiconductor manufacture. It is a further object of the invention to provide an improved stripping solution that affords enhanced processing characteristics. These and other objects of the invention will become apparent from the description of the invention which follows.

The formulations employed in the present invention are composed to provide a stripping solution free of phenolics and chlorinated hydrocarbons such that the mixture of sulfonic acids functions in such a way that photoresists are clearly dissolved from substrate surfaces and oil-free water rinsing results.

In accordance with the invention, sulfones, preferably those that are water soluble, are incorporated into the stripping compositions and leave the effect of suppressing the tendency to stain the semiconductor substrate, a drawback which is especially prevalent on aluminum bond pads. To avoid particle generation during water rinsing which may result from use of sulfones that are not water soluble, sulfones that are substantially soluble in water are preferred. The sulfones contemplated for use in accordance with the present invention are those of the formula $$R^1SO_2R^2$$

wherein $R^1$ and $R^2$ may be the same or different and are radicals selected from the group consisting of alkyl and aryl radicals having the values tabulated as follows:

| $R^1$ | $R^2$ |
| --- | --- |
| $CH_3$, $C_2H_5$, | $CH_3$, $C_2H_5$, |
| $C_3H_7$, $C_6H_5CH_2$ | $C_3H_7$, $C_6H_5CH_2$ |
| $X\eta(C_6H_5-\eta)-$ | $X\eta(C_6H_4-\eta)-SO_3H$ |
| $X = H, CH_3, C_2H_5$ | $X = H, CH_3, C_2H_5$ |
| $\eta = 1-5$ | $\eta = 1-4$ |
| $X\eta(C_6H_4-\eta)SO_3H$ | $X\eta(C_6H_4-\eta)SO_3H$ |
| $X = H, CH_3, C_2H_5$ | $X = H, CH_3, C_2H_5$ |
| $CH_3(CH_2)\eta C_6H_5-$ | $CH_3(CH_2)\eta C_6H_5-$ |
| $\eta = 8-12$ | $\eta = 8-12$ | and

Cyclic structures wherein $R^1$ is linked to $R^2$ and have the formula $$(CH_2)_\eta SO_2$$

$$\eta = 4-7$$

DESCRIPTION OF THE PREFERRED EMBODIMENTS

The present invention provides a composition which is effective in removing photoresist, both positive and negative type, and a method for removing photoresist from inorganic substrates, without the use of phenol or phenol compounds or chlorinated hydrocarbon compounds and their corresponding disadvantages. The surfactant sulfonic acid acts effectively as a photoresist stripper.

The surfactant sulfonic acids that have been found to be effective for removing organic photoresist are those having 12-20 carbons.

Exemplary of such aryl sulfonic acids suitable for use in accordance with the present invention are hexylbenzene sulfonic acid, heptylbenzenesulfonic acid, cotylbenzenesulfonic acid, decylbenzenesulfonic acid, dodecylbenzenesulfonic acid, tridecylbenzenesulfonic acid, quadecylbenzenesulfonic acid, and the like.

Blends of these surfactant sulfonic acids may also be employed so long as the number average carbon number is between 12 and 20. Solutions containing a major proportion of higher sulfonic acid of over 15 carbons, which is particularly dodecylbenzenesulfonic acid are among the preferred blends.

The preferred surfactant sulfonic acid for use in accordance with this invention is dodecylbenzenesulfonic acid although decylbenzenesulfonic acid may also be used.

The solvent or solvent system which are to be used must be materials which do not deter from the stripping effectiveness of the surfactant sulfonic acid. The solvent or solvent system itself is not critical to the stripping, i.e., the function of the sulfonic acid, since the function of the solvent is merely to reduce the viscosity and to render the sulfonic acid more readily water rinsable. Of course, the solvent should be miscible with the sulfonic acid and not react therewith and the most desirable solvents are those which do not induce corrosion on materials such as aluminum. For the present invention, the solvent must not contain chlorinated hydrocarbons, phenol or phenol compounds.

Preferred components of the aromatic hydrocarbon solvent are alkylaryl compounds having 1-14 alkyl carbons. Such compounds contain a benzene ring with one or more alkyl chains. Each alkyl chain may be straight or branched, but the straight-chain alkyl groups are preferred for biodegradability. Preferred examples of such compounds include toluene, xylene, ethylbenzene, trimethylbenzene, cumene, phenyloctane, dodecylbenzene, phenyl nonane, tridecylbenzene, tridecyltoluene and triethylbenzene and mixtures of such compounds. The preferred aromatic hydrocarbon solvents are mixtures of compounds with 9-13 alkyl carbons or 15-19 total carbons, dodecylbenzene, or mixtures having an average of about 18 total carbons.

The composition is free of halogenated hydrocarbons such as perchloroethylene and dichlorobenzene. Such solutions are generally biodegradable as compared to solutions containing halogenated hydrocarbons.

Other solvents may also be used provided they are free of phenol, phenol compounds and chlorinated hydrocarbon free. However, such other components are preferred only in smaller quantities than the aromatic hydrocarbon.

The present invention also includes a hydrotropic aromatic sulfonic acid of 6-9 carbons which may be benzenesulfonic acid, toluenesulfonic acid, xylenesulfonic acid, ethylbenzenesulfonic acid, methylethylbenzenesulfonic acid, trimethylbenzenesulfonic acid, propylbenzenesulfonic acid, cumenesulfonic acid or mixtures thereof. The total group of names hydrotropic sulfonic acids will sometimes be referred to herein as "hydrotropes" and the group excluding benzene sulfonic acid will be referred to as "alkylaryl hydrotropes." It should be appreciated that the alkylaryl hydrotropes have 7-9 carbons. Preferred are toluenesulfonic acid and benzenesulfonic acid, with benzenesulfonic acid being more preferred. The several alkylbenzenesulfonic acids may be one isomer such as paratoluene acid or a mixture of isomers such as para and orthotoluenesulfonic acid.

It has been found that although the stripping compositions disclosed in the above noted U.S. Pat. No. 4,165,294 are stabilized against metal corrosion such as by a fluoride inhibitor and are substantially anhydrous, i.e., contain less than 1% water, again to prevent metal corrosion, nevertheless the aforementioned undesirable brown staining of substrate still occurs. This "staining" effect, caused by a deposit of undetermined composition originating in the stripper is particularly noticed following photoresist removal of the opening bonding pads. In accordance with the discovery of the present invention, this staining effect is avoided by including a minor amount, i.e., about 0.5 to about 10 weight percent and preferably about 1 to about 5 weight percent, of a water soluble sulfone type material in the stripper. Water solubility is important to avoid precipitation of solids during the water rinsing stage following stripping. Preferably dialkyl (i.e., (dimethyl, diethyl), cyclo-alkyl (i.e., sulfolane) and sulfonated diarylsulfones (i.e., mono and disulfonic acids from diphenol sulfone, ditolyl and dixylylsulfone).

In accordance with the invention the problem involving the adverse effects resulting from the stripping solution disclosed in U.S. Pat. No. 4,165,294 on the substrate metals on which such stripping compositions are used in the course of semiconductor manufacture, and referred to herein as "brown staining", may be avoided by the use of a sulfolane additive in the composition. The brown staining, which is particularly visible on aluminum bonding contact pads under 50 to 100X magnification. This staining effect is so objectionable in semiconductor processing that unless the brown stain effect can be avoided, the use of such sulfonic acid strippers would be discontinued by commercial processors.

This invention incorporates water soluble sulfones into sulfonic acid-hydrocarbon stripping solutions in order to suppress staining of aluminum bond pads with water solubility preferred in order to avoid particle generation during water rinsing steps stemming from processing of water insoluble sulfones.

The following formulation provides a stripping solution free of phenolics and chlorinated hydrocarbons, and may be used with various sulfonic acids that functions in such a way that photoresists are clearly dissolved from substrate surfaces and with oil free water rinsing results. This formulation has the following compositions:

|  | Weight Parts |
| --- | --- |
| Benzene Sulfonic Acid | 35.5 |
| Xylene Sulfonic Acid | 15.2 |
| Dodecylbenzene Sulfonic Acid | 45.8 |
| Dodecylbenzene | 1 |
| Sulfolane | 2.0 |
| HF (as malononitrile complex) | 200 ppm |
| H$_2$O | 0.3% |
| H$_2$SO$_4$ | .3 |

The sulfones as a class have the general formula R$^1$SO$_2$ which may be employed in accordance with the invention and can be either aryl or alkyl.

The values for R$^1$ and R$^2$ for the sulfones incorporated in the photoresist stripping compositions are summarized as follows:

| R¹ | R² |
|---|---|
| CH₃, C₂H₅, | CH₃, C₂H₅, |
| C₃H₇, C₆H₅CH₂ | C₃H₇, C₆H₅CH₂ |
| Xη(C₆H₅—η)— | Xη(C₆H₄—η)—SO₃H |
| X = H, CH₃, C₂H₅ | X = H, CH₃, C₂H₅ |
| η = 1–5 | η = 1–4 |
| Xη(C₆H₄—η)—SO₃H | Xη(C₆H₄—η)SO₃H |
| X = H, CH₃, C₂H₅ | X = H, CH₃, C₂H₅ |
| CH₃(CH₂) ηC₆H₅— | CH₃(CH₂)ηC₆H₅— |
| η = 8–12 | η = 8–12 |

Cyclic structures wherein R¹ is linked to R² and have the formula (CH₂)ηSO₂

η = 4–7

In use, sulfonic acid-hydrocarbon mixtures as included in (Table I of U.S. Pat. No. 4,165,294) will generate a thin layer of material (deposit) on aluminum surfaces exposed to the stripping solution during semiconductor processing. This deposition, which appears brown under 50–100X magnification, does not form continuously but rather as a function of stripper composition, stripping bath life and stripping bath temperature. Once the staining cycle is known for a given mixture the absence of staining can be achieved by including low concentration of sulfones to the stripping formulation.

EXAMPLE 1

A sulfonic acid mixture suitable for removing photoresist from aluminum containing semiconductor substrates without causing browning was prepared as follows: 50 wt. parts of benzene sulfonic acid (a mixture of hydrotropic sulfonic acids e.g., benzenesulfonic acid, toluenesulfonic acid, xylenesulfonic acid, ethylbenzene sulfonic acids may also be used), 48 wt. parts dodecylbenzene sulfonic acid containing 6% dodecylbenzene and 2 wt. parts sulfolane were mixed and 2800 ppm of a complex formed from malono-nitrile and hydrofluoric acid (2:1 mol ratio malono-nitrile to HF) is dissolved in the resulting stripping solution to prevent corrosion of aluminum metal during photoresist stripping from semiconductor substrates. In use, this stripping solution is comparatively free of brown staining.

EXAMPLE 2

A second stripping solution suitable for use in processing aluminum semiconductors is prepared utilizing the components in proportions described in Example 1. Diphenylsulfone monosulfonic acid is substituted for sulfolane. This solution when compared with a solution in which the diphenylsulfone monosulfonic acid is omitted is relatively free of brown staining.

EXAMPLE 3

A third stripping solution suitable for use in processing aluminum semiconductors is prepared utilizing the components in proportions described in Example 1. Diphenylsulfone disulfonic acid is substituted for sulfolane with results comparable to those obtained with the stripping solution of Example 2.

I claim:
1. A composition for stripping photoresist from an inorganic substrate comprising in combination:
   (a) from about 5 to about 60 weight percent of an alkarylsulfonic acid surfactant having 12–20 carbon atoms;
   (b) from about 5 to about 95 weight percent of a hydrotropic sulfonic acid having 6–9 carbons;
   (c) from 0 to about 40 weight percent of a halogen-free aromatic hydrocarbon solvent with a boiling point above 150° C.; and
   (d) from about 0.5 to about 10 weight percent of a substantially water soluble sulfone of the formula

R¹SO₂R² where R¹ and R² may be the same or different and are selected from the group consisting of alkyl radicals, aryl radicals and alkylaryl radicals of 1 to 20 carbon atoms and including cyclic structures wherein R¹ is linked to R² and have the formula (CH₂)ₙSO₂ wherein is 4 to 7;
   said composition being free of phenol compounds and chlorinated hydrocarbon compounds and being substantially clear water rinsable.

2. The composition of claim 1 wherein (d) is sulfolane.

3. The composition of claim 1 wherein (a) is dodecylbenzenesulfonic acid.

4. The composition of claim 1 wherein (c) is dodecylbenzene.

5. The composition of claim 3 wherein (d) is sulfolane.

6. The composition of claim 5 wherein (c) is dodecylbenzene.

7. The composition of claim 1 wherein (d) is present in amounts of from about 1 to about 5 weight percent.

* * * * *